United States Patent [19]

Isogai

[11] Patent Number: 4,720,035
[45] Date of Patent: Jan. 19, 1988

[54] METHOD OF REFLOW BONDING ELECTRONIC PARTS ON PRINTED CIRCUIT BOARD AND APPARATUS USED THEREFOR

[75] Inventor: Yoshio Isogai, Kawasaki, Japan

[73] Assignee: Fujitsu Limited, Kawasaki, Japan

[21] Appl. No.: 3,845

[22] Filed: Jan. 16, 1987

[30] Foreign Application Priority Data

Jan. 17, 1986 [JP] Japan .................. 61-008411

[51] Int. Cl.⁴ .................. B23K 1/02; B23K 3/04; B23K 35/14
[52] U.S. Cl. .................. 228/102; 228/180.2; 228/10; 228/44.7; 228/45; 228/51; 219/85 D
[58] Field of Search .................. 228/102, 106, 180.2, 228/6.2, 9, 10, 44.7, 45, 51; 219/234, 85 CA, 85 CM, 85 D, 85 F

[56] References Cited

U.S. PATENT DOCUMENTS

| | | | |
|---|---|---|---|
| 3,382,564 | 5/1968 | Gallantine | 228/180.2 |
| 3,895,214 | 7/1975 | Winter | 228/51 |
| 4,034,202 | 7/1977 | Vandermark | 228/51 |
| 4,500,032 | 2/1985 | Ackerman | 228/6.2 |
| 4,654,507 | 3/1987 | Hubbard et al. | 219/85 D |

FOREIGN PATENT DOCUMENTS 24726 2/1980 Japan .................. 228/180.2

Primary Examiner—Nicholas P. Godici
Assistant Examiner—Samuel M. Heinrich
Attorney, Agent, or Firm—Staas & Halsey

[57] ABSTRACT

Reflow bonding of electronic parts such as large scale integrated circuits onto a printed circuit board, especially on multi-layer printed circuit board, requires that bonding tips press down the part leads with a uniform pressure and in a precise position on the printed circuit board for repeated operations. According to the present invention, the bonding tips providing a protrusion having an acute angle toward part leads, a first driving means for vertical movement of the bonding tips following a predetermined sequence, and a second driving means for opening and closing a gap between two bonding tips are provided in a reflow bonding apparatus. The method comprises steps of: (a) bonding tips are lowered on the printed circuit board, a contact position being taken as the reference position; (b) bonding tips are raised by a specified distance and the gap therebetween is closed, clipping part leads from both sides; (c) bonding tips are again lowered to a bonding position, pressing down part leads on the printed circuit board; and (d) reflow bonding by heating up the tip portion of bonding tips.

15 Claims, 12 Drawing Figures

METHOD OF REFLOW BONDING ELECTRONIC PARTS ON PRINTED CIRCUIT BOARD AND APPARATUS USED THEREFOR

BACKGROUND OF THE INVENTION

1. Field of the Invention

This invention relates to a method of reflow bonding electronic parts such as large scale integrated circuits (abbreviated as LSI), resistor packages, connectors, etc. on a printed circuit board, and also relates to an apparatus used therefor. More particularly, this invention is intended to ensure reliable bonding between electronic part leads and foot patterns on a printed circuit board. This is especially important when a multi-layer printed circuit board is used, and a printed board assembly is utilized in a large scale information processing system.

2. Description of the Prior Art

The method of reflow bonding of the prior art is explained using FIG. 1. FIG. 1 shows an example of a perspective view of a reflow bonding apparatus. The external appearance of the apparatus is almost similar for both types of the prior art and the present invention. A table 50, on which a printed circuit board (not shown) is fixed, is movable along X and Y axes. A bonding head assembly 51 is provided and it has two reflow bonding tips 52 which plays an important role in the present invention. Each bonding tip has a shape such that an electric current can flow into a horizontal tip portion of a bonding tip 52 and flows out therefrom, and each leg portion is connected to a welding power source 53 and an electric current heats up the horizontal tip portion of bonding tip 52 during a bonding operation.

The apparatus is controlled by switches on an operator control panel 55 and the operation is sequentially controlled by a controller, which is housed in a lower cabinet 54. Further explanations on other accessories which have no direct relation to the present invention are omitted.

FIG. 2 shows schematically an enlarged side view of a tip portion 521 of the bonding tip 52 in the prior art at the time when the bonding head 51 in FIG. 1 moves downward by a drive mechanism attached thereto onto the horizontally bent portion 211 of a lead 21 of an electronic part 2 and presses down the lead on a printed circuit board 1 with a pressurizing force. The bent portion 211 is arranged just on a foot portion 61 of the circuit pattern on a printed circuit board 1.

FIG. 3 shows a side view of the tip portion 521 of bonding tip 52 in the direction of an arrow X in FIG. 2. Tip portion 521 shows that two legs are formed and each leg is connected separately to the terminal of welding power source 53. The electric heating current flows in from one leg portion 521a and flows out to another leg portion 521b, and the horizontal portion 521c is heated up during the specified period of bonding operation, because it is formed such that it has a relatively higher resistance than that of the leg portion. The hatched area 522 is coated with an insulating material to protect the sensitive electronic parts 2 from a damage due to the electric current flow.

The width W of tip portion in FIG. 3 is determined such that it sufficiently covers the width of a plurality of leads 211 aligned in the vertical direction of FIG. 2. The width W and the distance D between two bonding tips in FIG. 2 change depending on the outline dimensions of electronic parts 2, therefore the bonding tips are changed when parts having different dimensions are to be reflow bonded.

As an example in the prior art, FIG. 4 shows schematically a side elevational view of a portion of the bonding head 51 including bonding tips 52, printed circuit board 1 and electronic part 2 to be reflow bonded, with portions broken away for clarity.

Bonding head provides a pusher rod 35 (partly shown), which is movable up and down along the Z direction, and also provides a coiled spring 31 (partly shown) and a guide arm 34 for each bonding tip 52. Bonding tip is fitted in the guide arm 34, and can be movable upward in the Z direction by a coiled spring 31 after it hits against the printed circuit board or leads thereon, and is pushed upward against a force of coiled spring 31. When the pusher rod 35 moves downward by a drive mechanism (not shown) and the horizontal portion 521c of bonding tip touches lead 211 on the printed circuit board 1, coiled spring 31 begins to contract. The pusher rod has a specified stroke of movement, therefore the coiled spring 31 gives a pressurizing force proportional to the contraction amount thereof onto the leads to be reflow bonded. When the movement of pusher rod is completed by a drive mechanism, then the reflow bonding operation starts by flowing electric current from the welding power source 53 shown in FIG. 1.

The above described structure of the bonding head in the prior art has several weak points such that it is difficult to get an uniform pressurizing force onto leads placed on the printed circuit board 1 because of a thickness change of the printed circuit board, or warp thereof and so on. Moreover the lateral contact positions in the X direction of each bonding tip 52 on lead 211 are liable to deviate from the precise expected positions. Consequently the fillet of soldered portion A shown in FIG. 2 is not formed satisfactory.

SUMMARY OF THE INVENTION

The present invention relates to an improvement in a method of reflow bonding an electronic part on a printed circuit board with an uniform bonding pressure and also in a precise position on part lead at all times of repeated reflow bonding processes, and also relates to an improvement in an apparatus with regard to the bonding head and its driving mechanism utilized therein.

These improvements result in obtaining a high reliability of reflow bonding quality and a remarkable increase of operation efficiency.

The above objects are achieved by an utilization of the bonding head structure schematically shown in FIG. 5, and FIG. 5 and a step sequence diagram shown in FIG. 6 give a general idea of the present invention.

Main differences in the structure of FIG. 5 from that of FIG. 4 of the prior art exist in that a cam 32, a spring 33, and a sensor 4 are provided, and that the bonding tip 52 has a claw-shaped cross section 523 at its tip portion.

The principal steps of reflow bonding process shown in FIG. 6 are as follows;
  (a) when the pusher rod 35 is at the initial position A, cam 32 of an elliptical shape is held its longer axis horizontal, therefore the gap between two bonding tips 52 is maintained as open position,
  (b) the pusher rod is moved down vertically from the initial position A to the second position B until the tip portion 521c contacts top portion of leads 211 or the printed circuit board 1, and the position B is taken as the reference position and is determined when the sensor 4 detects the contact, (c) the pusher rod 35 is then raised to a position C by a specified small distance $d_1$, and the cam is rotated by 90 degrees and the gap between bonding tips is closed by a contracting force of spring 33 resulting in a clipping motion of part leads 21 from both sides by claw-shaped bonding tips 523, (d) the pusher rod is again lowered by the total distance of the above specified $d_1$ in step (c) plus $d_2$, wherein $d_2$ is defined as the distance of pressurizing or contraction of coiled spring 31 which depends on the characteristics thereof, (e) heating up the tip portion of bonding tips 52 and reflow bonding leads to printed circuit board by controlling welding power source, (f) the pusher rod 35 is raised to the same position C as that in step (c), opening bonding tips, (g) the pusher rod is returned to the initial position A.

The particular features of the present invention exists in that the position B is selected as the reference position, and downward movement of pusher rod 35 is precisely controlled by the distance $(d_1+d_2)$ from position C, and thus the pressurizing forces on the leads are maintained uniform during repeated operations. And furthermore, at the position C, the bonding tips 52 are closed and clip part leads 21 by spring 33, therefore, the tip portion of the bonding tips can sit precisely on reflow bonding positions of leads.

Further objects and advantages of the present invention will be apparent from the following description, reference being had to the accompanying drawings wherein preferred embodiments of the present invention are clearly shown.

DETAILED DESCRIPTION OF THE PREFERRED EMBODIMENTS

Figure 5:
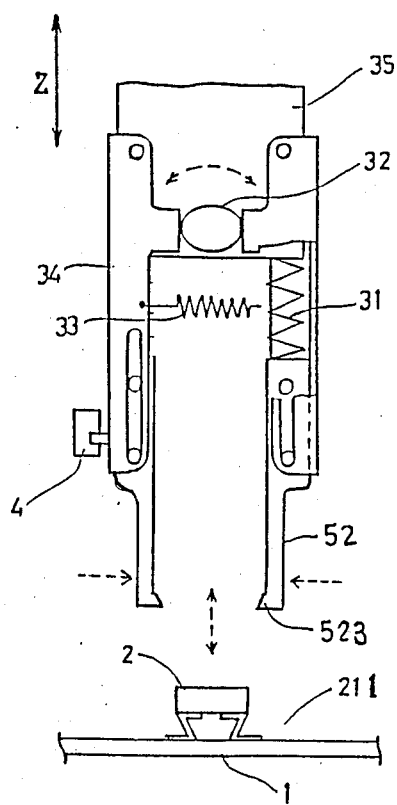
FIG. 5 shows a schematic side view of a bonding head of the present invention to explain a principal structure and its mechanism.
Figure 6:
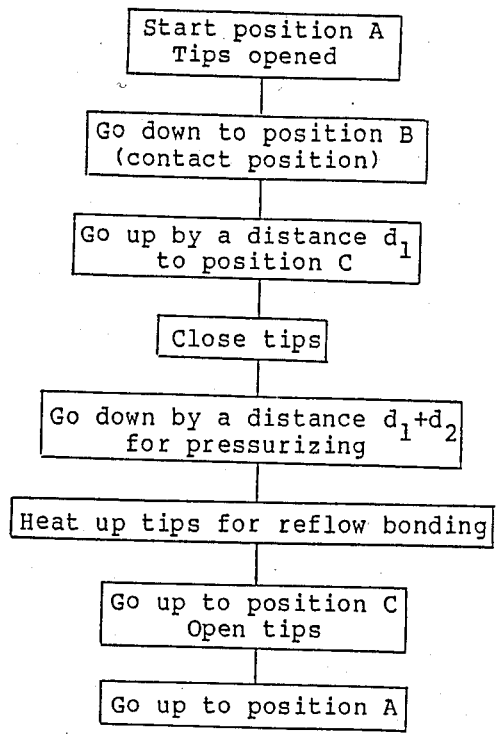
FIG. 6 is a diagram showing principal steps of reflow bonding according to the present invention.

The principal mechanism of the present invention has been disclosed previously using the schematic drawing of FIG. 5. However, in the actual reflow bonding apparatus, the construction and control mechanism consist of more complicated and elaborate system. An example of the system configuration is shown in a block diagram of FIG. 7.

Figure 7:
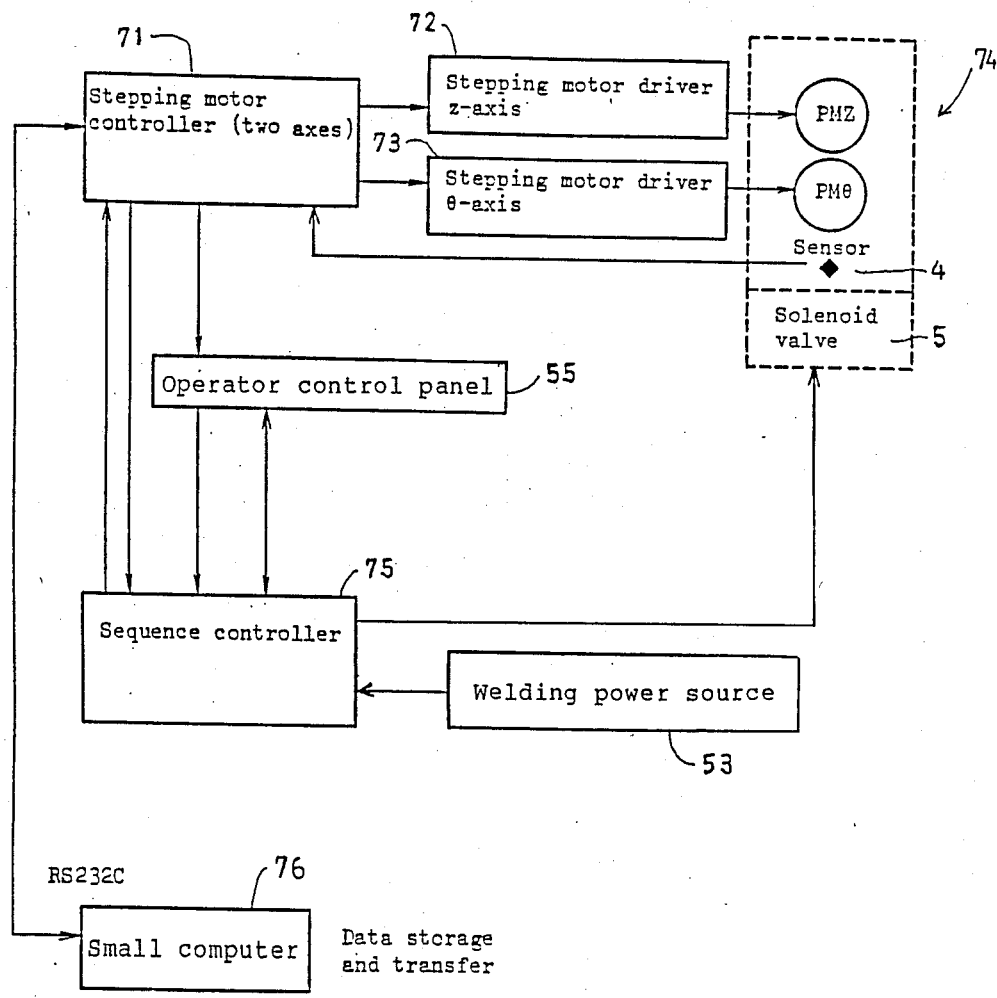
FIG. 7 is a diagram showing a system configuration of an embodiment of the present invention.

The system shown in FIG. 7 represents that the pusher rod 35 in FIG. 5 can be movable up and down (in Z-direction) and rotatable around its axis by two stepping motor drivers 72 (Z direction) and 73 ($\theta$ direction) respectively both controlled by stepping motor controller 71.

Figure 1:
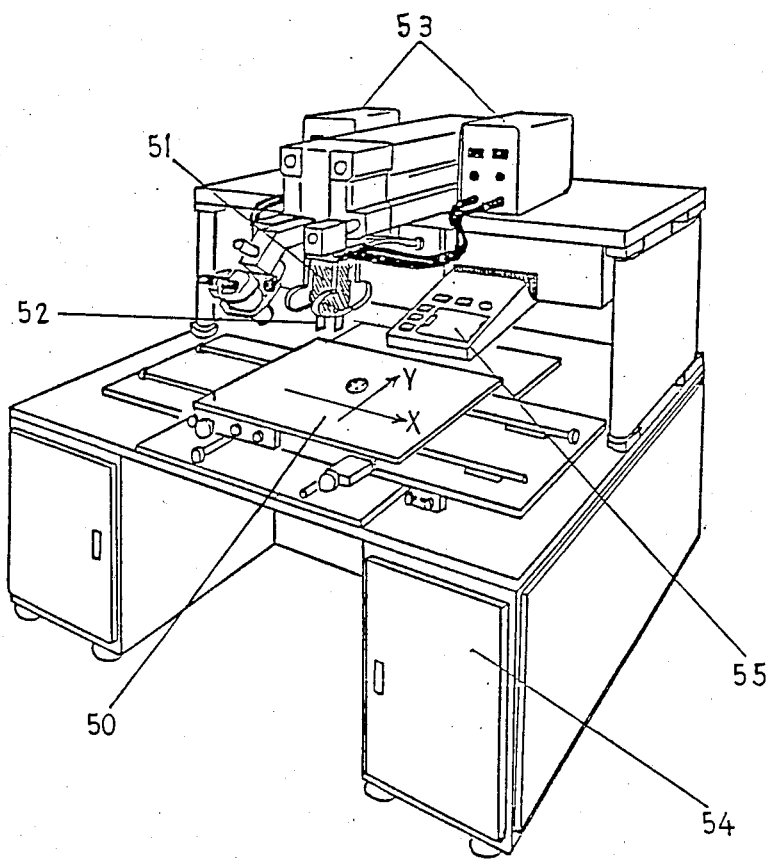
FIG. 1 shows a perspective view of a reflow bonding apparatus to get a general idea of its construction.
Figure 2:
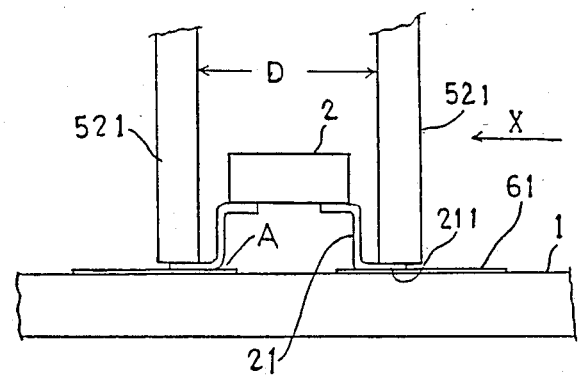
FIG. 2 is a enlarged side elevational view of a tip portion of the bonding tips in the prior art, a printed circuit board and an electronic part, when bonding tips are lowered on the printed circuit board.
Figure 3:
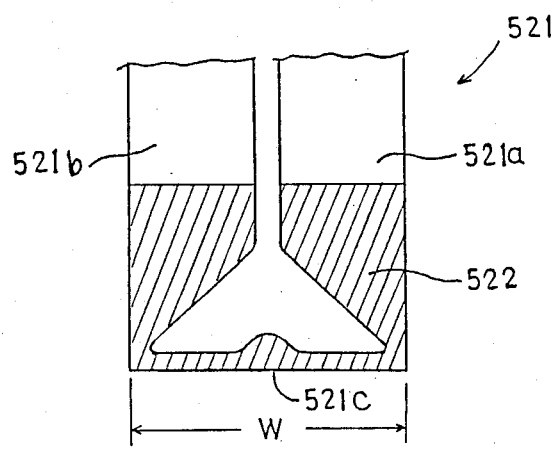
FIG. 3 shows a side view of a tip portion of bonding tip in the direction of an arrow X in FIG. 2.
Figure 4:
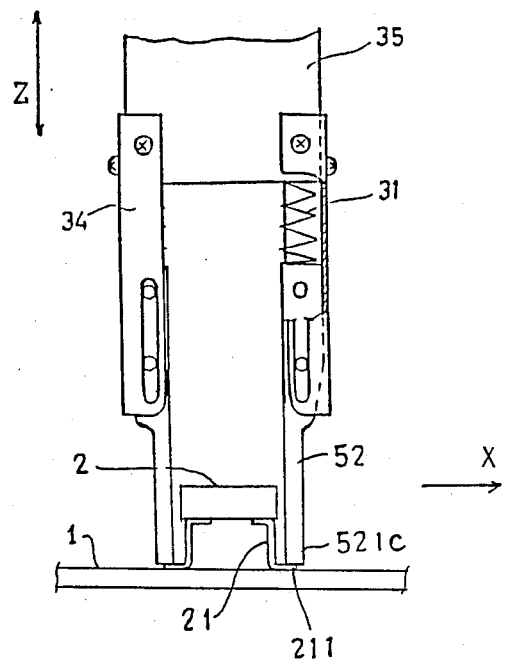
FIG. 4 shows a schematic side view of a portion of bonding head in the prior art including bonding tips, a printed circuit board, and an electronic part.

With regard to the rotational movement, reflow bonding operation with the bonding tips aligned parallel to the X direction (shown in FIG. 1) becomes possible by rotating the pusher rod around its axis by 90 degrees.

The system has a sequence controller 75, which is connected to operator control panel 55, stepping motor controller 71 above described, solenoid valve 5 for open/close operation of bonding tips 52, and welding power source 53. In an actual apparatus, solenoid valve 5 is used which has a combined function of the cam 32 and spring 33 in FIG. 5.

The sensor 4 fitted in the bonding head section 74, is also connected to stepping motor controller 71. And total system is connected to a small computer 76, which provides data of bonding conditions on many kinds of electronic parts to be applied for reflow bonding.

The operation of the bonding head 51 is schematically illustrated in FIGS. 8 through 11. The numeral references are the same as those used in FIG. 5. The detailed operations are explained using FIGS. 8 through 11 and supplemented by FIG. 7 for the system control.

Figure 8:
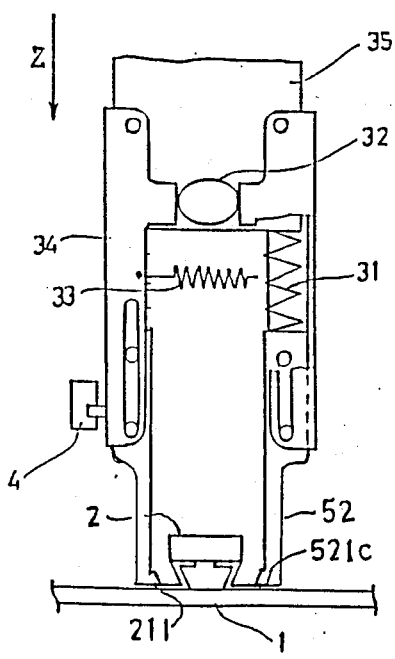
FIGS. 8 through 11 show schematic side views of a bonding head, printed circuit board, and an electronic part to explain the principles of the present invention corresponding to some of the representative steps of reflow bonding.

FIG. 8 shows the condition in which the pusher rod 35 has been lowered from the initial position A and the horizontal tip portion 521c of bonding tips 52 are just contacting the printed circuit board or the part leads 211 (position B). Because the gap between bonding tips are opened at this time, it depends on lead shape whether bonding tips are contacting the printed circuit board or contacting the lead portion thereon. After detecting the contact sensor 4 sends signal to the stepping motor controller 71 in FIG. 7.

Figure 9:
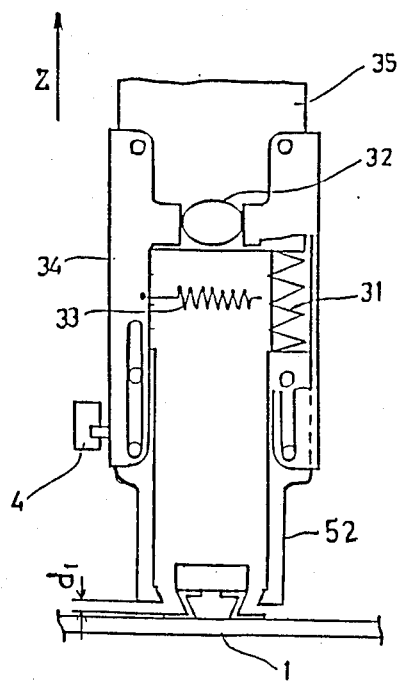

And next FIG. 9 shows the pusher rod 35 is raised by a specified distance $d_1$, for example 0.7 to 0.8 mm, to the position C by stepping motor driver 72.

Figure 10:
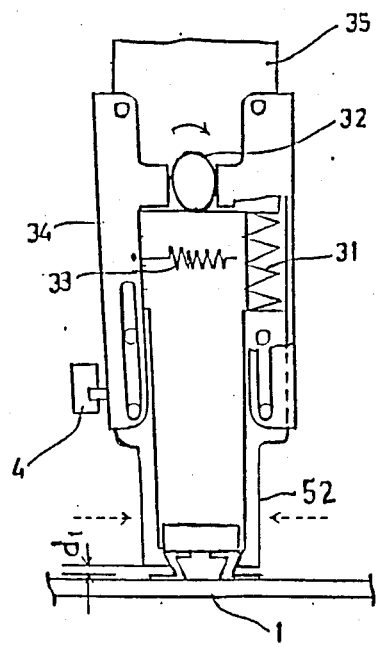

And then the gap between bonding tips are closed by a contracting force of spring 33 with the rotation of cam 32 as shown in FIG. 10. In FIG. 7 solenoid valve 5 closes the gap.

Figure 11:
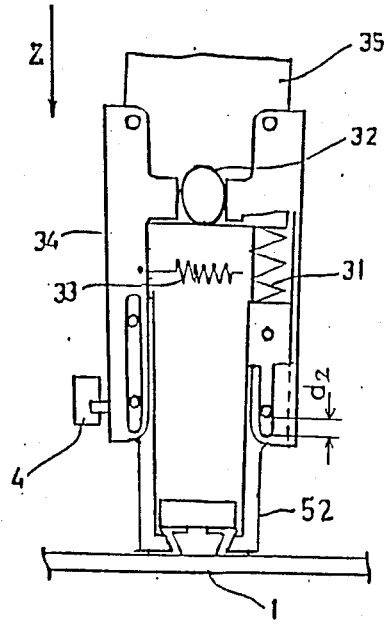

And next FIG. 11 shows the pusher rod is again lowered by a distance $(d_1+d_2)$, for example 1.5 to 2.0 mm, wherein $d_2$ represents a contract dimension of the coiled spring 31 inside the guide arm 34. The dimension $d_2$ is determined by the required pressurizing force for each shape of electronic parts and the characteristics of coiled spring 31. During the additional movement $d_2$ of pusher rod, bonding tips are remaining at the same position and pressurizing forces are increasing gradually. At the end of the movement when the predetermined pressurizing force is obtained, welding power source is switched on and reflow bonding is carried out.

Finally the pusher rod is raised to the position C, opening the gap between tips, and then returns to the initial position A.

Figure 12:
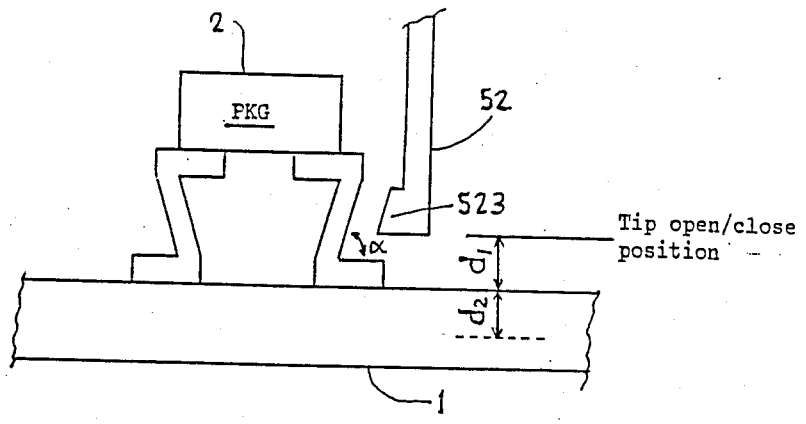
FIG. 12 shows a side view of preformed leads of an electronic part and a related tip shape of bonding tips.

It is desirable the electronic part leads subject to reflow bonding process are formed beforehand such that the leads facing each bonding tip 52 make an angle $\alpha$ of less than 90 degrees on bonding side as shown in FIG. 12. The cross section shows a shape of a "Z"

character or a turned over "Z" character. When the tip portion of bonding tips has a claw-shaped cross section 523, then bonding tips can fit in and clip easily and firmly part leads from both sides. This has an effect of obtaining an uniform pressurizing force and a projected position on lead surface.

The present invention may be practiced or embodied in still other ways without departing from the spirit or essential characteristics thereof.

For example, as explained for FIG. 8, bonding tips are lowered onto the printed circuit board 1 and then sensor 4 detects the contact. However, in some cases, wirings are formed in a neighboring area of bonding regions and the pressing motion on the wiring should be avoided. In this case, the method is modified such that the sensor detects the contact position (reference position) when the bonding tips having closed gap is lowered on a part package and make a contact with its surface, and bonding tips are raised and opened. Then bonding tips are again lowered to the position of a height of about 0.7 mm from the printed circuit board, and then they are closed. Subsequent steps are similar as those explained in the previous embodiment.

Though a pair of bonding tips are used in the previous embodiments, two pairs of bonding tips orthogonally arranged may be applicable for bonding the LSI having lead arrangements on four sides of a square-shaped package.

The presently disclosed embodiments are to be considered in all respects as illustrative and not restrictive, the scope of the invention being indicated by the appended claims, rather than the foregoing description, and all changes which come within the meaning and range of equivalency of the claims are therefore, to be embraced therein.

What I claim are as follows:

1. A method of reflow bonding an electronic part on a printed circuit board, said method comprising the steps of:
    (a) providing a plurality of bonding tips in pairs, each said bonding tip being provided with a heating means for a horizontal tip portion thereof, and a cross section of said horizontal tip portion having a protrusion on bottom surface thereof facing leads of said electronic part;
    (b) providing a first driving means for said bonding tips, said driving means comprising a pusher rod and a spring, wherein said pusher rod is moved vertically to predetermined positions sequentially and said spring has a function of pressing said bonding tips downward to the printed circuit board when downward movement of said pusher rod exceeds a specified value of a contact position of said bonding tips;
    (c) providing a second driving means for opening and closing a gap between said bonding tips in pairs facing with each other;
    (d) providing a sensor fitted with said bonding tips for detecting said contact position of the bonding tips;
    (e) operating the first driving means downward until said sensor detects that the bonding tips make said contact with a specified object on the printed circuit board;
    (f) operating the first driving mechanism upward by a specified distance;
    (g) operating the second driving means for closing the gap between said bonding tips, and operating the first driving means for lowering said pusher rod until said bonding tips are pressing part leads with a specified pressurizing force; and
    (h) reflow bonding by heating said bonding tips.

2. A method of reflow bonding an electronic part on a printed circuit board according claim 1, wherein in step (a), said heating means for a horizontal tip portion of the bonding tip consists of a closed circuit formed by the bonding tip itself and two terminals thereof connected to welding power source, wherein a horizontal tip portion thereof has a higher resistance than other portions such that it can be heated up by flowing electric current therethrough.

3. A method of reflow bonding an electronic part on a printed circuit board according claim 1, wherein in step (a), one pair of bonding tips are utilized facing with each other.

4. A method of reflow bonding an electronic part on a printed circuit board according claim 1, wherein in step (a), two pairs of bonding tips are utilized, each pair facing with each other and two pairs orthogonally arranged.

5. A method of reflow bonding an electronic part on a printed circuit board according claim 1, wherein in step (a), said cross section of the protrusion of the bonding tip has a shape forming an acute angle with a bottom horizontal surface.

6. A method of reflow bonding an electronic part on a printed circuit board according claim 1, wherein in step (b), said first driving means includes an additional mechanism to rotate said pusher rod around its axis, whereby an alignment of said bonding tips is rotated around the axis of the pusher rod.

7. A method of reflow bonding an electronic part on a printed circuit board according claim 1, wherein a separate preforming step of part leads is added;
    said preforming step includes a process such that leads facing each bonding tip make an angle of less than 90 degrees with the horizontal portion thereof, the shape like a character "Z" or turned over "Z".

8. A method of reflow bonding an electronic part on a printed circuit board according claim 1, wherein in step (e), said specified object is the surface of said printed circuit board or the bonding region of part leads thereon.

9. A method of reflow bonding an electronic part on a printed circuit board according claim 1, wherein in step (e), said specified object is the package surface of the electronic part on said printed circuit board, and the following step (f') is added after step (f);
    (f') operating the second driving means for opening the gap between bonding tips and then operating first driving means downward for a specified distance.

10. A reflow bonding apparatus for an electronic part on a printed circuit board comprising:
    (a) a plurality of bonding tips in pairs, each said bonding tip being provided with a heating means for a horizontal tip portion thereof, and a cross section of said horizontal tip portion having a protrusion on bottom surface thereof facing leads of said electronic part;
    (b) a first driving means for said bonding tips, said driving means comprising a pusher rod and a spring, wherein said pusher rod is moved vertically to predetermined positions sequentially and said spring has a function of pressing said bonding tips downward to the printed circuit board when downward movement of said pusher rod exceeds a specified value of a contact position of said bonding tips;
(c) a second driving means for opening and closing a gap between said bonding tips in pairs facing with each other; and
(d) a sensor fitted with said bonding tips for detecting said contact position of the bonding tips.

11. A reflow bonding apparatus for an electronic part on a printed circuit board according to claim 10, wherein in item (a), said heating means for a horizontal tip portion of the bonding tip consists of a closed circuit formed by the bonding tip itself and two terminals thereof connected to welding power source, wherein a horizontal tip portion thereof has a higher resistance than other portions such that it can be heated up by flowing electric current therethrough.

12. A reflow bonding apparatus for an electronic part on a printed circuit board according to claim 10, wherein in item (a), said plurality of bonding tips in pairs consists of one pair of bonding tips facing with each other.

13. A reflow bonding apparatus for an electronic part on a printed circuit board according to claim 10, wherein in item (a), said plurality of bonding tips in pairs consists of two pairs of bonding tips, each pair facing with each other and two pairs orthogonally arranged.

14. A reflow bonding apparatus for an electronic part on a printed circuit board according to claim 10, wherein in item (a), said cross section of the protrusion of the bonding tip has a shape forming an acute angle with a bottom horizontal surface.

15. A reflow bonding apparatus for an electronic part on a printed circuit board according to claim 10, wherein in item (b), said first driving means includes an additional mechanism to rotate said pusher rod around its axis, whereby an alignment of said bonding tips is rotated around the axis of the pusher rod.

* * * * *